United States Patent
Park et al.

(10) Patent No.: US 7,321,137 B2
(45) Date of Patent: Jan. 22, 2008

(54) RGB LIGHT EMITTING DIODE PACKAGE WITH IMPROVED COLOR MIXING PROPERTIES

(75) Inventors: Young Sam Park, Seoul (KR); Hun Joo Hahm, Sungnam (KR); Hyung Suk Kim, Suwon (KR); Jung Kyu Park, Suwon (KR); Young June Jeong, Suwon (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 27 days.

(21) Appl. No.: 10/959,154

(22) Filed: Oct. 7, 2004

(65) Prior Publication Data

US 2006/0001034 A1    Jan. 5, 2006

(30) Foreign Application Priority Data

Jul. 2, 2004    (KR) ................. 10-2004-0051422

(51) Int. Cl.
*H01L 33/00*    (2006.01)

(52) U.S. Cl. ..................... 257/98; 257/79; 257/88; 257/100; 257/E33.067

(58) Field of Classification Search .............. None
See application file for complete search history.

(56) References Cited

U.S. PATENT DOCUMENTS

| | | | | |
|---|---|---|---|---|
| 5,903,391 | A * | 5/1999 | Toshima et al. ............ | 359/599 |
| 6,657,382 | B2 * | 12/2003 | Nagai et al. | |
| 6,881,980 | B1 * | 4/2005 | Ting | |
| 2002/0132880 | A1 * | 9/2002 | Choi et al. ................ | 523/334 |
| 2004/0104391 | A1 * | 6/2004 | Maeda et al. | |
| 2004/0136667 | A1 * | 7/2004 | Leu et al. ................... | 385/120 |
| 2005/0045897 | A1 * | 3/2005 | Chou et al. | |

FOREIGN PATENT DOCUMENTS

| | | |
|---|---|---|
| JP | 04-137570 | 5/1992 |
| JP | 05-240665 | 9/1993 |
| JP | 10-004216 A | 1/1998 |
| JP | 10-190067 A | 7/1998 |
| JP | 10-284759 A | 10/1998 |
| JP | 2001-85747 | 3/2001 |
| JP | 2004-179430 A | 6/2004 |

OTHER PUBLICATIONS

Butts et al., Encyclopedia of Polymer Science and Technology, "Silicones," Apr. 15, 2003, John Wiley and Sons, Inc., vol. 11, p. 765-766; http://www.mrw.interscience.wiley.com/emrw/9780471440260/epst/article/pst338/current/html?hd=All%2Csilicones.*
Japanese Patent Office, Office Action mailed Jun. 19, 2007 and English Translation.

* cited by examiner

*Primary Examiner*—Leonardo Andujar
*Assistant Examiner*—Kevin Quinto
(74) *Attorney, Agent, or Firm*—Lowe Hauptman Ham & Berner

(57) ABSTRACT

An RGB light emitting diode package with improved color mixing properties includes red, green, and blue light emitting diode chips provided on a reflector. A photomixing material and a filler resin scatters rays so as to uniformly mix the rays emitted from the light emitting diode chips. The photomixing material and filler resin are applied onto upper sides of the light emitting diode chips while being mixed with each other, and the photomixing material is uniformly dispersed in the filler resin.

10 Claims, 5 Drawing Sheets

(a)

(b)

(a)

(b)

(c)

(d)

RGB LIGHT EMITTING DIODE PACKAGE WITH IMPROVED COLOR MIXING PROPERTIES

RELATED APPLICATION

The present application is based on, and claims priority from, Korean Application Number 2004-51422, filed Jul. 2, 2004, the disclosure of which is hereby incorporated by reference herein in its entirety.

BACKGROUND OF THE INVENTION

1. Field of the Invention

The present invention pertains, in general, to a red, green, and blue light emitting diode (RGB LED) package and, more particularly, to an RGB light emitting diode package, which employs a photomixing material to assure excellent color mixing properties in a relatively small area, thereby making slimness thereof possible.

2. Description of the Prior Art

A light emitting diode densely emits rays having transparent colors in a high degree of efficiency. Additionally, the light emitting diode does not burn easily due to heat, and is a semiconductor element, and thus, it has excellent primary operational characteristics, high resistance to vibration, and durability with regard to repeated on/off operations. Hence, the light emitting diode is applied to various indicators and light sources.

Recently, applications of the light emitting diode are expanding, for example, it is used as an illuminator. The light emitting diode is produced by using gallium arsenide (GaAs), gallium phosphide (GaP), gallium nitride (GaN), and silicon carbide (SiC) depending on the desired light color, intensity of illumination and the like, and its PN junction part can emit visible rays at a relatively low voltage when it is biased in an avalanche breakdown region. In the case of the indicator, power is applied through a multiplexing network in order to reduce a power consumption, and the light emitting diode serves to change a structure of the indicator to emit rays with different wavelengths. The light emitting diode may be individually used or may be used in a form of matrix structure.

Recently, a RGB (red, green, and blue) light emitting diode with ultra-high luminousness and high efficiency has been developed, and an LED display with a large-sized screen has appeared, which employs such a light emitting diode. The LED display is advantageous in that it has excellent characteristics, for example it is operated with low power, lightweight, and has a long life, and thus, it is believed that the LED display will be applied to various fields.

Many efforts have been made to develop a white light source using a light emitting diode. Since the light emitting diode has an emission spectrum useful for generating monochromatic light, it is necessary to arrange three luminous components of R, G, and B in such a manner that they are in close proximity to each other to diffuse and mix different rays, emitted from the components, with each other so as to generate a light source for white light. When white light is generated by the arrangement, white light with a desired tone may be not obtained because of changes in a tone of color, brightness, and other factors of the luminous components.

Furthermore, if the luminous components are made from different materials, the power required to generate light is different among the different luminous components, and thus, it is necessary to apply different voltages to the different luminous components, resulting in inconvenience in the production of a complicated circuit. Moreover, since the luminous components consist of luminous semiconductor components, the tone may be changed or nonuniform color may be obtained due to temperature characteristics, chronological variations, and differences between operation devices, making a uniform mixing of rays, emitted from the luminous components, impossible.

Generation of white light using an RGB light emitting diode in a conventional manner is shown in FIG. 1. As shown in FIG. 1, red, green, and blue light emitting diode (LED) chips 2 operable to emit light rays 1 are provided on a reflector 3. A filler resin 4 encapsulates LED chips 2 and reflector 3. Since colors (rays 1) are mixed depending on a directive angle of a chip, a predetermined distance must be assured to make the uniform mixing of colors possible. Alternatively, there is a method of mounting individual chips in a form of lens, but in this method, there is a limit to uniformly mix colors and it is cumbersome to design a complicated lens.

Accordingly, even though the light emitting diode is an effective light emitting device for generating separate colors, it cannot be yet used as a desired light source for emitting white light employing the luminous components.

Meanwhile, recently, an RGB light emitting diode package, which has a very thin structure and employs LED chips having high brightness, has been preferred. However, the RGB light emitting diode package is problematic in that there is a limit to uniformly mix colors in the package because of a restriction in an area.

SUMMARY OF THE INVENTION

Therefore, an object of the present invention is to provide an RGB light emitting diode package, which employs a photomixing material to assure excellent color mixing properties in a relatively small area, thereby making slimness thereof possible.

The above object can be accomplished by providing an RGB (red, green, blue) light emitting diode package with improved color mixing properties, including red, green, and blue light emitting diode chips provided on a reflector, on which elements are to be installed or mounted. A photomixing material and a filler resin scatters rays so as to uniformly mix the rays emitted from the light emitting diode chips. In this regard, the photomixing material and filler resin are mixed with each other and applied onto upper sides of the light emitting diode chips in the package, and the photomixing material is uniformly dispersed in the filler resin.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Hereinafter, a detailed description will be given of the present invention.

The present inventors found that in an RGB light emitting diode package, when a resin-based or opal-based photomixing material (called a scattering agent) is uniformly dispersed in conjunction with a filler resin in the package, rays emitted from a light emitting diode are effectively scattered, and thus, it is possible to uniformly mix colors of the rays in a short distance, thereby accomplishing the present invention.

Examples of the photomixing material useful in the present invention include resin-based or opal-based photomixing materials. The resin-based photomixing material is particularly preferable. Since the opal-based photomixing material cannot be combined with a resin for filler, it is very apt to conglomerate due to its high surface energy, and it mostly sinks in the resin owing to its high specific gravity, but the resin-based photomixing material has a spherical chain structure and contains metal groups forming connection rings in conjunction with the resin for filler, and thus, it may be easily dispersed uniformly with the resin for filler.

The resin-based photomixing material useful in the present invention has a similar specific gravity to a filler for a conventional light emitting diode, and has excellent dispersibility, and thus, it helps to uniformly spread light, emitted from an RGB light emitting diode, in a wide radiation angle.

Particularly, the resin-based photomixing material is preferably exemplified by an epoxy resin and a silicon resin.

The epoxy resin typically has a specific gravity of 1.230-1.189, and excellent mechanical properties such as bending strength and hardness.

The silicon resin is a thermoplastic synthetic resin having a molecular structure which includes a siloxane bond (Si—O bond), containing silicon and oxygen alternately arranged, as a skeleton, and methyl, phenyl, and hydroxyl groups bonded to silicon.

The resin-based photomixing material contains the methyl group like the silicon resin expressed by the following Formula 1.

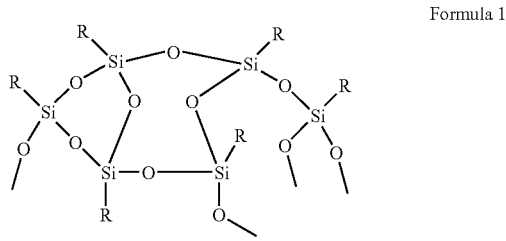

Formula 1

(wherein, R is the methyl group)

Since the resin-based photomixing material contains the methyl group, it bonds strongly to the filler resin, and it uniformly disperses in the filler resin without precipitation because it has a specific gravity similar to that of the filler resin.

Figure 1:
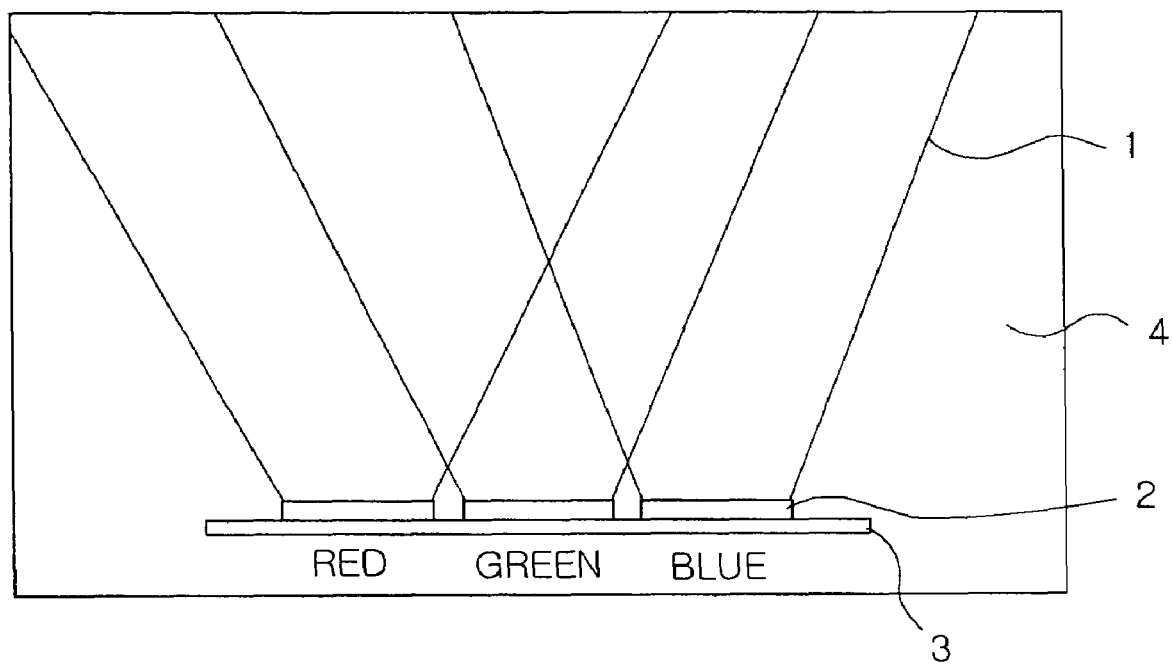
FIG. 1 illustrates a conventional RGB light emitting diode package, which generates white light by the arrangement of RGB chips.
Figure 2:
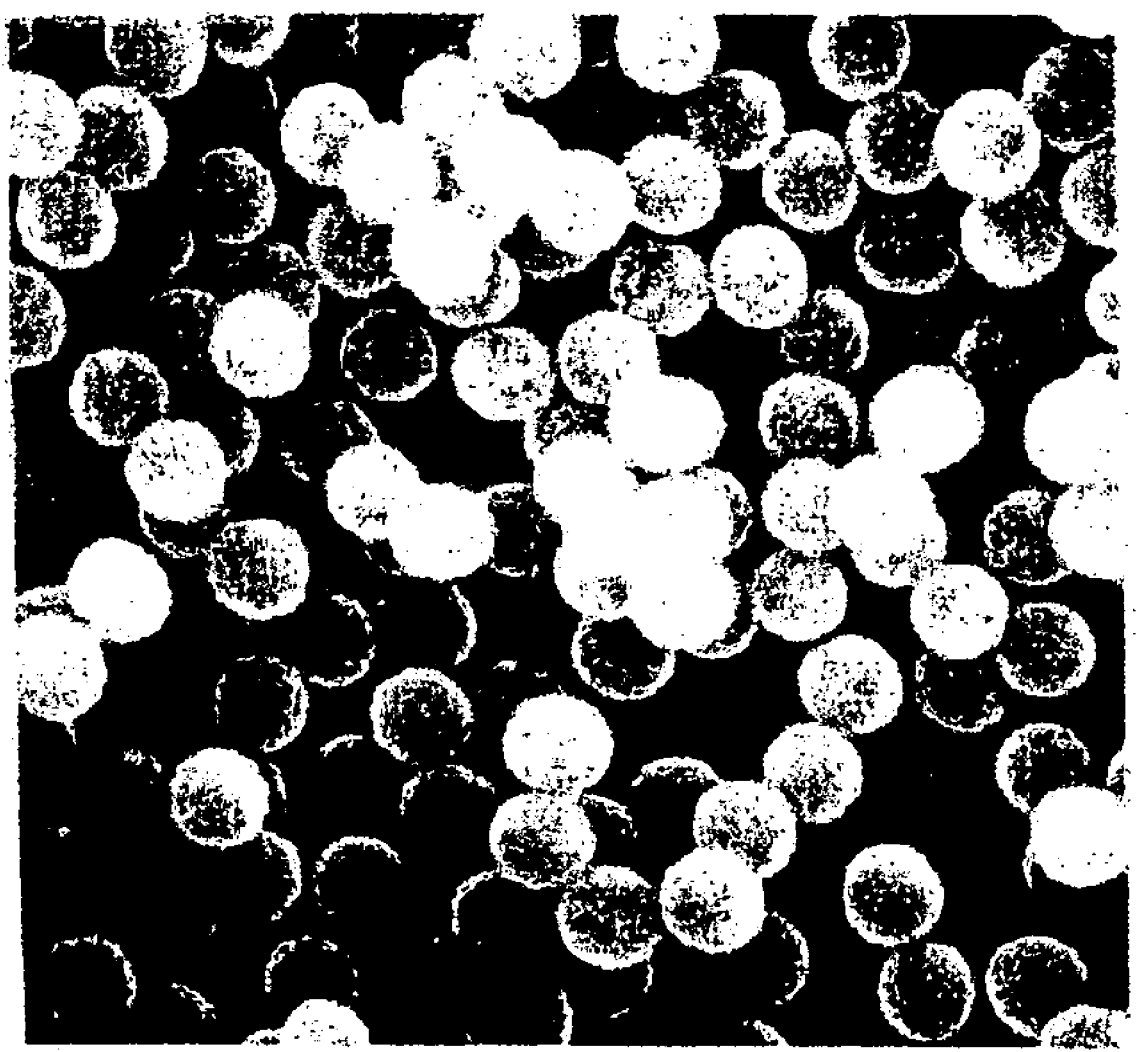
FIG. 2 is an electron microscope picture of a silicon resin photomixing material according to the present invention.
Figure 3:
FIGS. 3a and 3b are electron microscope pictures showing a mix of the silicon resin photomixing material and a filler of a light emitting diode (FIG. 3a—a view illustrating a surface of the mixture, and FIG. 3b—a sectional view of the mixture)
Figure 3:

Additionally, an example of the silicon resin photomixing material used in the present invention is shown in FIG. 2, and FIGS. 3a and 3b are electron microscope pictures showing a mix of the silicon resin photomixing material and the filler of the light emitting diode (FIG. 3a—a view illustrating a surface of the mixture, and FIG. 3b—a sectional view of the mixture).

As shown in FIG. 2, the silicon resin photomixing material used in the present invention has the shape of a spherical bead or particle, and when it is added in a powder state to the filler, the shape of the photomixing material is maintained as it is, as shown in FIGS. 3a and 3b.

Figure 4:
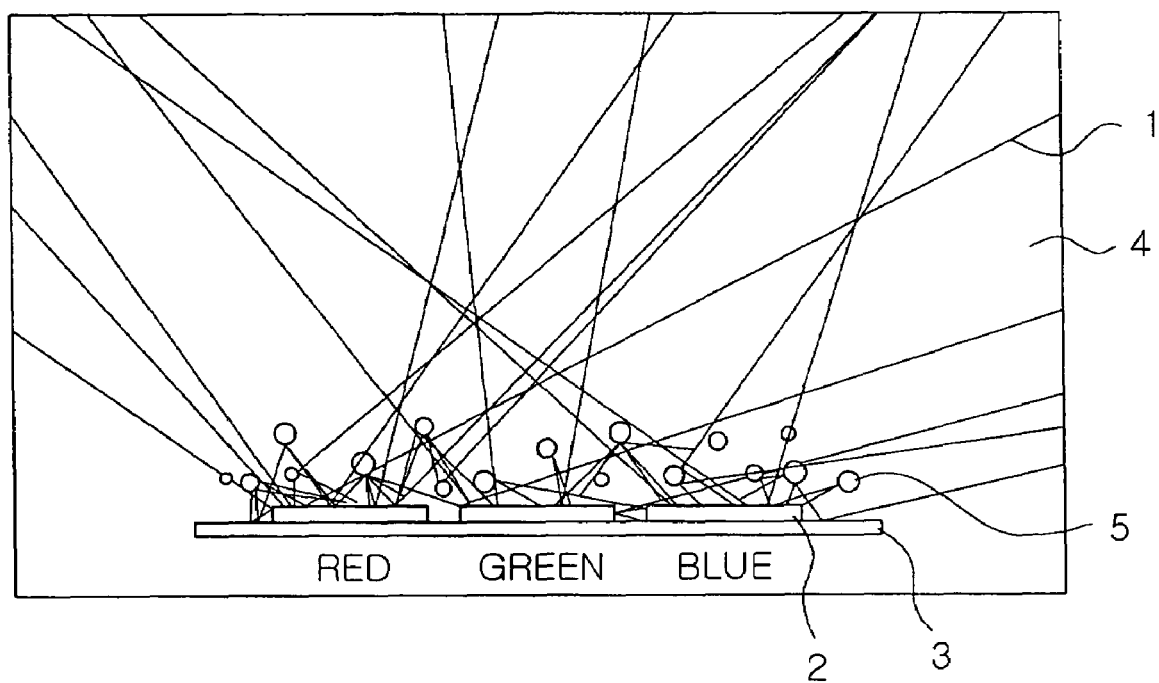
FIG. 4 illustrates an RGB light emitting diode package with improved color mixing properties according to the present invention, in which the photomixing material is applied to RGB chips.

Furthermore, FIG. 4 illustrates the RGB light emitting diode package, to which the resin-based photomixing material is applied according to the present invention. In particular, the RGB light emitting diode package of FIG. 4 includes red, green, and blue light emitting diode chips 2 provided on a reflector 3. A photomixing material 5 and a filler resin 4 scatter rays 1 so as to uniformly mix the rays 1 emitted from the light emitting diode chips 2. The photomixing material 5 and filler resin 4 are mixed with each other and applied onto upper sides of the light emitting diode chips 2 in the package, and the photomixing material 5 is uniformly dispersed in the filler resin 4.

As shown in FIG. 4, the uniformly dispersed resin-based photomixing material 5 serves to easily scatter the rays 1 to help to uniformly spread the rays 1 in a wide radiation angle, and functions to diversify the paths of the rays 1 emitted from the R, G, and B light emitting diodes 2. Hence, the resin-based photomixing material 5 helps to uniformly mix the rays 1 emitted from the light emitting diodes 2 provided on reflector 3. Hence, the resin-based photomixing material 5 helps to uniformly mix the rays 1 emitted from the LED chips 2.

It is preferable that the photomixing material is used in an amount of 1-20 wt % based on a total weight of the photomixing material and filler resin.

Further, it is preferable that the photomixing material has a specific gravity similar to that of the filler resin so as to be uniformly dispersed in the filler resin. Preferably, the specific gravity of the photomixing material is 0.5-1.8.

When the specific gravity of the photomixing material is excessively high, the amount of the photomixing material that sinks in the filler may increases in the course of mixing it with the filler, causing hindrance of scattering of the rays, but when the specific gravity of the photomixing material is excessively low, it floats on the surface of the filler in the course of mixing it with the filler, also resulting in hindrance of scattering of the rays. More preferably, the photomixing material has a specific gravity of 0.9-1.8.

The photomixing material and filler resin mixed with each other are applied onto upper sides of diode chips in the package. If the photomixing material forms layers at predetermined intervals on the light emitting diode chips, for example the photomixing material is not dispersed in the package but forms layers on the surface of the package, the photomixing material functions to change the directions of the rays only at the surface of the package, and thus, the rays emitted from the light emitting diodes may be nonuniformly mixed with each other.

In this respect, it is preferable that the photomixing material is added in powder form to the liquid filler so as to be uniformly dispersed in a bead or particle form in the filler in such a way that after the photomixing material and filler are uniformly mixed with each other using a mixer, bubbles are removed through a degassing process in a vacuum.

As described above, the photomixing material is dispersed in a bead or particle form in the filler. In this regard, the photomixing material in bead or particle form preferably has a diameter of about 0.1-30 μm.

As well, it is possible to use the epoxy resin and silicon resin separately, and if they both exist in a powder form, they may be used in a mixture. When they are used in a mixture, the mixing ratio is preferably 1:1.

Illustrative, but non-limiting examples of the filler resin suitable for the present invention include a transparent epoxy filler resin or silicon filler resin containing a reactive group having a methyl group.

Having generally described this invention, a further understanding can be obtained by reference to a certain specific preparation example which is provided herein for purposes of illustration only and is not intended to be limiting unless otherwise specified.

PREPARATION EXAMPLE

An RGB light emitting diode chip, which has a light emitting wavelength peak of 465 nm and a gallium nitride (GaN) semiconductor structure, was used as an RGB light emitting diode. A silicon resin or epoxy resin was used as a photomixing material, and it was uniformly mixed in an amount of 1-20 wt % with a filler resin based on a total weight of the photomixing material and filler resin. At this time, the photomixing material in powder form was mixed with the filler resin in a liquid phase, and uniformly agitated using a mixer, thereby completing the mixing of the photomixing material and filler. Subsequently, bubbles were removed through a degassing process under a vacuum atmosphere, and the mixture was applied onto an RGB light emitting diode package. The application may be conducted according to dispensing, screen printing, and scattering methods. Successively, the resin was hardened under proper hardening conditions. At this time, in the case of using the silicon resin as the photomixing material, the hardening was conducted at 150° C. for about 1 hour, and in the case of using the epoxy resin as the photomixing material, the hardening was carried out at 120-180° C. for about 5 hours.

Evaluation of Color Mixing Properties Using a Computer Simulation

The color mixing properties of the RGB light emitting diode was evaluated using the computer simulation (Light Tools, Optical Research Associates) in a ray tracing manner for the following cases:

1) a case that the diode contained no photomixing material, 2) a case that the photomixing material formed layers at predetermined intervals on light emitting diode chips (photomixing material layers were formed on a surface of the package), 3) a case that the photomixing material (3 wt %) and filler resin were positioned on upper surfaces of the diode chips while they were mixed with each other (the photomixing material was distributed in the package), and 4) a case that the photomixing material (10 wt %) and filler resin were positioned on upper surfaces of the diode chips while they were mixed with each other (the photomixing material was distributed in the package).

The numbers of RGB rays were 20 each, and a directive angle was 140°. It was assumed that a shape of the photomixing material was small bead because the actual size of the photomixing material (scattering agent) in a sphere form was very small (2 μm or less), and the photomixing material was composed of thermoplastic polymethyl methacrylate (PMMA). Also, it was assumed that air filled the inside of the diode and there was no refraction and reflection at the surface of the diode, in order to evaluate only the effect of the photomixing material. The results of the ray tracing analysis are shown in FIGS. 5a to 5d.

Figure 5:
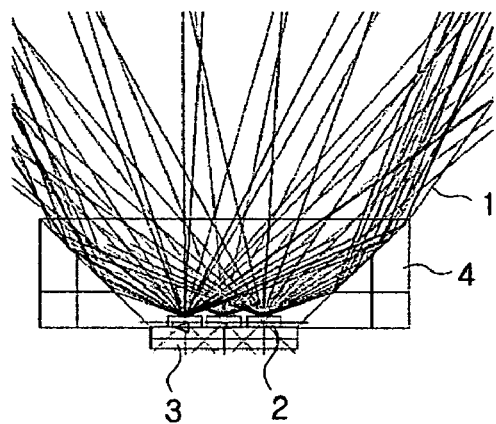
FIGS. 5a to 5d illustrate color mixing properties of RGB light emitting diodes, which are gained through a computer simulation according to the present invention.
Figure 5:
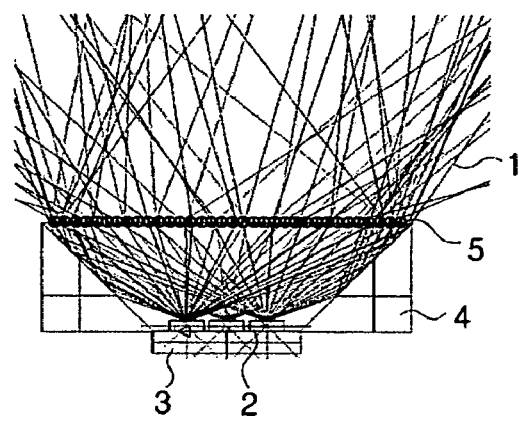
Figure 5:
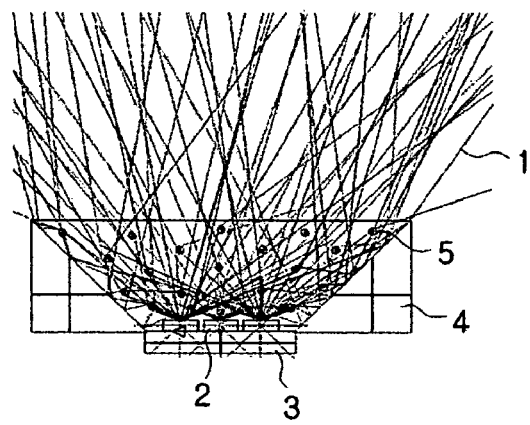
Figure 5:
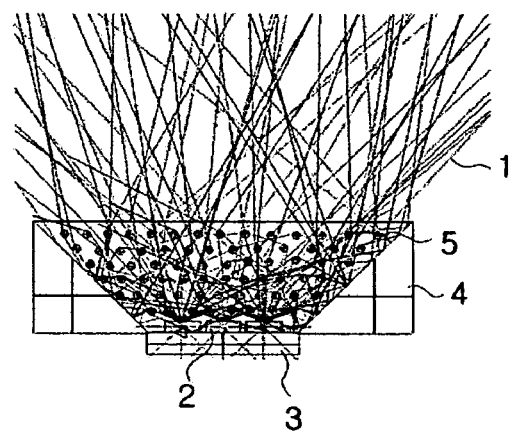

From FIGS. 5a to 5d, it can be seen that the rays are more effectively scattered in the case of distributing the photomixing material in the package (FIGS. 5c and 5d) than in the case of applying no photomixing material onto the light emitting chips (FIG. 5a) and the case of forming the photomixing material layers on the surface of the package (FIG. 5b). Particularly, dispersion of the rays is greater in the case of using a large amount of the photomixing material (FIG. 5d) than in the case of using a small amount of the photomixing material (FIG. 5c). Meanwhile, if the photomixing material is present on the surface of the package, it functions only to change the directions of the rays on the surface of the package, which is not largely different from the case of employing no photomixing material.

Furthermore, in view of the production process, there is an inconvenience in the course of molding the diode because the photomixing material must be injected into the additionally formed layers when the photomixing material forms layers on the surface of the package as in FIG. 5b, but when the photomixing material is dispersed in the package according to the present invention, it is not necessary to form additional layers, and thus, it is believed that the package can be produced through a very simple process.

Therefore, it can be seen that when the photomixing material is present in the package, the rays are effectively scattered even though the photomixing material exists in a small amount, and that when the amount of the photomixing material is increased, dispersion of the rays increases, resulting in effective scattering of the rays, and thus, it is possible to uniformly mix colors in a short distance.

As described above, an RGB light emitting diode package according to the present invention is advantageous in that since it has excellent color mixing properties in a relatively small area, it is possible to realize slimness of the package while it is difficult to design a slim package using a conventional process in which there is a limit that an area large enough to mix colors must be provided.

The RGB light emitting diode of the present invention avoids the problem, occurring in the conventional process, of color variation due to positions of chips.

Another advantage of the RGB light emitting diode package according to the present invention is that it is possible to assure a wide radiation angle, and thus, it is usefully applied to illuminators.

What is claimed is:

1. An RGB (red, green, and blue) light emitting diode package, comprising:
   red, green, and blue light emitting diode chips provided above a reflector; and
   a photomixing material and a filler resin for scattering and uniformly mixing rays emitted from the light emitting diode chips;
   wherein, the photomixing material and filler resin cover upper surfaces of the light emitting diode chips, the photomixing material is uniformly dispersed in the filler resin, and the photomixing material constitutes 1-20 wt % of a total weight of the photomixing material and filler resin;
   wherein the photomixing material contains the methyl group;

wherein the photomixing material is at least one selected from the group consisting of an epoxy resin and a silicon resin; and wherein the epoxy and silicon resins are mixed with each other, and a mixing ratio of the epoxy and silicon resins is 1:1.

2. An RGB (red, green, and blue) light emitting diode package, comprising:

red, green, and blue light emitting diode chips provided above a reflector; and a photomixing material and a filler resin for scattering and uniformly mixing rays emitted from the light emitting diode chips;

wherein, the photomixing material and filler resin cover upper surfaces of the light emitting diode chips, the photomixing material is uniformly dispersed in the filler resin, and the photomixing material constitutes 1-20 wt % of a total weight of the photomixing material and filler resin;

wherein the photomixing material contains the methyl group; and wherein the filler resin having the photomixing material uniformly dispersed therein is in direct contact with the entire upper surfaces of said light emitting diode chips.

3. An RGB (red, green, and blue) light emitting diode package, comprising:

red, green, and blue light emitting diode chips provided above a reflector; and a photomixing material and a filler resin for scattering and uniformly mixing rays emitted from the light emitting diode chips;

wherein, the photomixing material and filler resin cover upper surfaces of the light emitting diode chips, the photomixing material is uniformly dispersed in the filler resin, and the photomixing material constitutes 1-20 wt % of a total weight of the photomixing material and filler resin;

wherein the photomixing material contains the methyl group; and wherein the filler resin having the photomixing material uniformly dispersed therein is directly applied on and in direct contact with the upper surfaces of said light emitting diode chips.

4. The RGB light emitting diode package as set forth in claim 3, wherein the photomixing material is an opal-based dispersing agent.

5. The RGB light emitting diode package as set forth in claim 3, wherein the photomixing material has a specific gravity of 0.5-1.8.

6. The RGB light emitting diode package as set forth in claim 3, wherein the photomixing material is

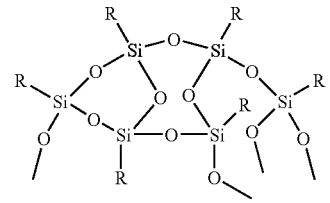

where R is the methyl group.

7. The RGB light emitting diode package as set forth in claim 3, wherein the photomixing material comprises thermoplastic polymethyl methacrylate (PMMA).

8. The RGB light emitting diode package as set forth in claim 3, wherein the photomixing material is a resin-based dispersing agent being at least one selected from the group consisting of an epoxy resin and a silicon resin.

9. The RGB light emitting diode package as set forth in claim 8, wherein the epoxy and silicon resins are mixed with each other, and a mixing ratio of the epoxy and silicon resins is 1:1.

10. An RGB (red, green, and blue) light emitting diode package, comprising:

red, green, and blue light emitting diode chips provided above a reflector; and a photomixing material and a filler resin for scattering and uniformly mixing rays emitted from the light emitting diode chips;

wherein, the photomixing material and filler resin cover upper surfaces of the light emitting diode chips, the photomixing material is uniformly dispersed in the filler resin, and the photomixing material constitutes 1-20 wt % of a total weight of the photomixing material and filler resin; and wherein the filler resin having the photomixing material uniformly dispersed therein is directly applied on and in direct contact with the upper surfaces of said light emitting diode chips.

* * * * *